United States Patent
Summerfelt et al.

(10) Patent No.: US 9,536,822 B2
(45) Date of Patent: Jan. 3, 2017

(54) DRAWN DUMMY FECAP, VIA AND METAL STRUCTURES

(75) Inventors: Scott R. Summerfelt, Garland, TX (US); Rajni J. Aggarwal, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1742 days.

(21) Appl. No.: 12/576,340

(22) Filed: Oct. 9, 2009

(65) Prior Publication Data
US 2010/0090340 A1   Apr. 15, 2010

Related U.S. Application Data

(60) Provisional application No. 61/104,904, filed on Oct. 13, 2008.

(51) Int. Cl.
| | |
|---|---|
| H01L 21/02 | (2006.01) |
| H01L 21/00 | (2006.01) |
| H01L 23/522 | (2006.01) |
| H01L 23/58 | (2006.01) |
| H01L 27/02 | (2006.01) |
| H01L 49/02 | (2006.01) |
| H01L 27/115 | (2006.01) |

(52) U.S. Cl.
CPC ......... *H01L 23/522* (2013.01); *H01L 23/5223* (2013.01); *H01L 23/585* (2013.01); *H01L 27/0207* (2013.01); *H01L 28/55* (2013.01); H01L 27/11507 (2013.01); H01L 2924/0002 (2013.01); H01L 2924/19041 (2013.01); H01L 2924/19043 (2013.01)

(58) Field of Classification Search
CPC ........................... H01L 23/522; H01L 27/0207
USPC ......... 257/29, E27.104, E21.664, 295; 438/3
See application file for complete search history.

(56) References Cited

U.S. PATENT DOCUMENTS

| | | | |
|---|---|---|---|
| 7,339,218 B2 | 3/2008 | Hidaka et al. | |
| 2002/0006674 A1* | 1/2002 | Ma et al. | 438/3 |
| 2003/0012117 A1* | 1/2003 | Ogawa et al. | 369/200 |
| 2003/0089954 A1* | 5/2003 | Sashida | 257/369 |
| 2003/0155595 A1* | 8/2003 | Okita | 257/295 |
| 2004/0183112 A1* | 9/2004 | Okita | 257/296 |
| 2004/0196618 A1* | 10/2004 | Komuro et al. | 361/306.3 |
| 2005/0118795 A1* | 6/2005 | Hidaka | H01L 27/105 438/593 |

(Continued)

OTHER PUBLICATIONS

Summerfelt et al., "Transistor Performance Modification with Stressor Structures," Nonprovisional Patent Application Filed: Oct. 9, 2009; U.S. Appl. No. 12/576,310; Texas Instruments Incorporated. Dallas, TX.

*Primary Examiner* — Matthew Landau
*Assistant Examiner* — Igwe U Anya
(74) *Attorney, Agent, or Firm* — Rose Alyssa Keagy; Charles A. Brill; Frank D. Cimino (57) ABSTRACT

An integrated circuit containing hydrogen permeable dummy vias configured in a linear or rectangular array and symmetrically positioned over a component in the integrated circuit. An integrated circuit containing matching components with identical layouts and hydrogen permeable dummy vias in identical configurations over the matching components. A process of forming an integrated circuit containing matching components with identical layouts and hydrogen permeable dummy vias in identical configurations over the matching components.

20 Claims, 10 Drawing Sheets

(56) References Cited

U.S. PATENT DOCUMENTS

| | | | |
|---|---|---|---|
| 2007/0007567 A1* | 1/2007 | Yaegashi et al. | 257/295 |
| 2008/0073683 A1* | 3/2008 | Hidaka et al. | 257/295 |
| 2008/0217669 A1* | 9/2008 | Kanaya | 257/295 |
| 2008/0224194 A1* | 9/2008 | Sashida | 257/295 |

* cited by examiner

DRAWN DUMMY FECAP, VIA AND METAL STRUCTURES

CROSS-REFERENCE TO RELATED APPLICATIONS

This application claims the benefit of priority under U.S.C. §119(e) of U.S. Provisional Application 61/104,904 filed Oct. 13, 2008.

The following co-pending patent application is related and hereby incorporated by reference: U.S. patent application Ser. No. 12/576,310 (titled Transistor Performance Modification With Stressor Structures) filed simultaneously with this application. With its mention in this section, this patent application is not admitted to be prior art with respect to the present invention.

FIELD OF THE INVENTION

This invention relates to the field of integrated circuits. More particularly, this invention relates to dummy via structures in integrated circuits.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Throughout this disclosure, references to hydrogen will be understood to include isotopes of hydrogen, for example deuterium. For the purposes of this disclosure, the term "electrically active" will be understood to mean a structure that is electrically connected to other components as part of an electrical circuit. Also for the purpose of this disclosure, the term "electrically inactive" will be understood to mean a structure that is not part of an electrical circuit.

An integrated circuit may contain electrically active ferroelectric layers under a hydrogen barrier, and hydrogen permeable electrically active vias which penetrate the hydrogen barrier to make electrical contact to the electrically active ferroelectric layers. The integrated circuit may also contain electrically inactive structures which include dummy hydrogen permeable vias and possibly electrically inactive ferroelectric layers. The electrically active vias and dummy vias include hydrogen permeable metal, such as titanium or tungsten. The ferroelectric layers include materials with dielectric constants above 100, such as lead zirconium titanate or barium strontium titanate.

A component in the integrated circuit located under the hydrogen barrier may have electrically inactive structures in a linear array or a rectangular array which is symmetrically positioned above the component. A linear array contains a single row or a single column of electrically inactive structures, in which individual electrically inactive structures are located at equally spaced positions. A rectangular array contains electrically inactive structures arranged in rows and columns, in which individual electrically inactive structures in each row and each column are located at equally spaced positions. In rectangular arrays, spacing in rows is not necessarily equal to spacing in columns. A symmetrically positioned array is such that opposite lateral boundaries of the component are equidistant from instances of the electrically inactive ferroelectric structures in the array.

A set of matched components in the integrated circuit located under the hydrogen barrier may have identical configurations of electrically inactive structures positioned over each of the matched components. Matched components have identical layouts, possibly with mirror symmetry, also known as reflection symmetry. A first matched component of the set which has mirror symmetry with respect to a second matched component of the set may have a configuration of electrically inactive structures which has mirror symmetry to a configuration of electrically inactive structures over the second component. Hereafter, statements regarding identicalness of layouts with regard to matching components are understood to include mirror symmetry.

Figure 1A:
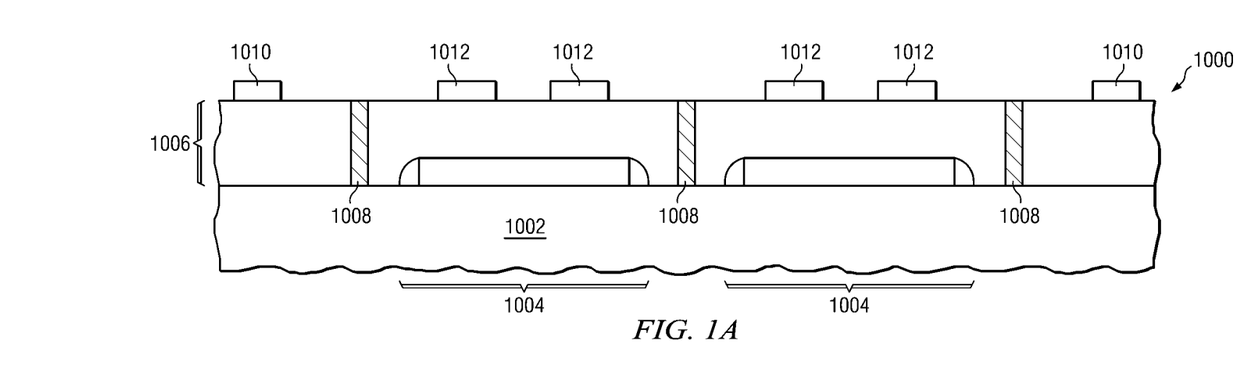
FIG. 1A through FIG. 1E are cross-sections of an integrated circuit containing electrically inactive structures with dummy vias and ferroelectric layers formed according to an embodiment of the instant invention, depicted in successive stages of fabrication.

FIG. 1A through FIG. 1E are cross-sections of an integrated circuit containing electrically inactive structures, including dummy vias and ferroelectric layers, formed according to an embodiment and depicted in successive stages of fabrication. Referring to FIG. 1A, the integrated circuit (1000) is formed on a substrate (1002) which is often a single crystal silicon wafer, but may be a single crystal wafer of another semiconductor such as gallium arsenide, a silicon-on-insulator (SOI) wafer, a hybrid orientation technology (HOT) wafer with regions of different crystal orientations, or other material appropriate for fabrication of the IC (1000). Components (1004) such as MOS transistors, capacitors, resistors and/or bipolar transistors are formed in and on the substrate (1002). In one realization of the instant embodiment, the components (1004) may be matched components. A dielectric layer (1006) is formed on an existing top surface of the integrated circuit (1000). The dielectric layer (1006) includes a pre-metal dielectric (PMD) layer which is typically a dielectric layer stack including a PMD liner, a PMD main layer, and an optional PMD cap layer. The PMD liner is commonly silicon nitride or silicon dioxide, 10 to 100 nanometers thick, deposited by plasma enhanced chemical vapor deposition (PECVD) on the existing top surface of the substrate (1002). The PMD main layer is commonly a layer of silicon dioxide, phospho-silicate glass (PSG) or boro-phospho-silicate glass (BPSG), commonly 100 to 1000 nanometers thick, deposited by PECVD on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer. Contacts (1008) are formed in the dielectric layer (1006). The contacts (1008) may be formed by defining contact areas on a top surface of the dielectric layer (1006)) with a contact photoresist pattern (not shown). Dielectric layer material may be removed using etch processes to form contact holes in the contact areas. The contact holes may be filled with a contact liner metal, such as titanium, and a contact fill metal, such as tungsten. Unwanted contact fill metal on the top surface of the dielectric layer (1006) may be removed using etching and/or CMP methods.

Electrically active ferroelectric structures (1010), such as electrically active ferroelectric capacitor structures, are formed over the dielectric layer (1006). Optional electrically inactive ferroelectric structures (1012) are formed over the dielectric layer (1006), possibly concurrently with the electrically active ferroelectric structures (1010). The ferroelectric structures (1010) and (1012) may be formed by depositing one or more layers of constituent materials of the ferroelectric structures (1010) and (1012) on the top surface of the dielectric layer (1006). A ferroelectric structure photoresist pattern, not shown, may be formed over the layers of ferroelectric materials to define areas for the ferroelectric structures (1010) and (1012). Unwanted ferroelectric materials may be removed by etching processes. The electrically inactive ferroelectric structures (1012) may be configured in a linear array or a rectangular array that is symmetrically positioned over each component (1004). For example, the ferroelectric structures (1010) and (1012) may be configured so that a density of ferroelectric material is maintained within a desired range, possibly providing improved process latitude during the etching of the ferroelectric structures (1010) and (1012). The lateral dimensions of the electrically inactive ferroelectric structures (1012) may be established during a design phase of the integrated circuit formation process sequence. In one realization of the instant embodiment, the ferroelectric structures (1010) and (1012) may include lead zirconium titanate or barium strontium titanate. In a specific realization, the ferroelectric structures (1010) and (1012) may be ferroelectric capacitors containing lead zirconium titanate or barium strontium titanate.

Figure 1B:
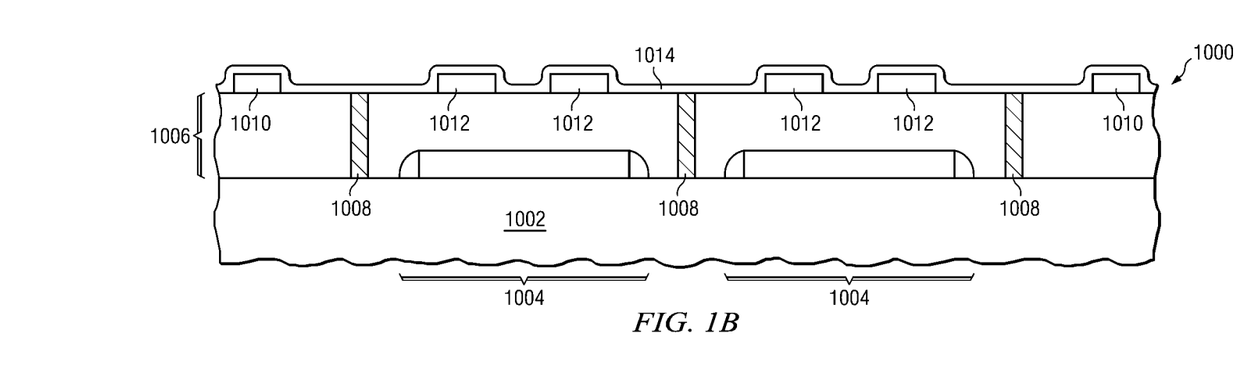

Referring to FIG. 1B, a hydrogen barrier (1014) is formed over the ferroelectric structures (1010) and (1012) and the dielectric layer (1006). In one realization of the instant embodiment, the hydrogen barrier (1014) may include aluminum oxide or silicon nitride. In another realization, the hydrogen barrier (1014) may be between 10 and 50 nanometers thick. However, integrated circuits with hydrogen barriers formed of other materials and thicknesses are within the scope of the instant embodiment.

Figure 1C:
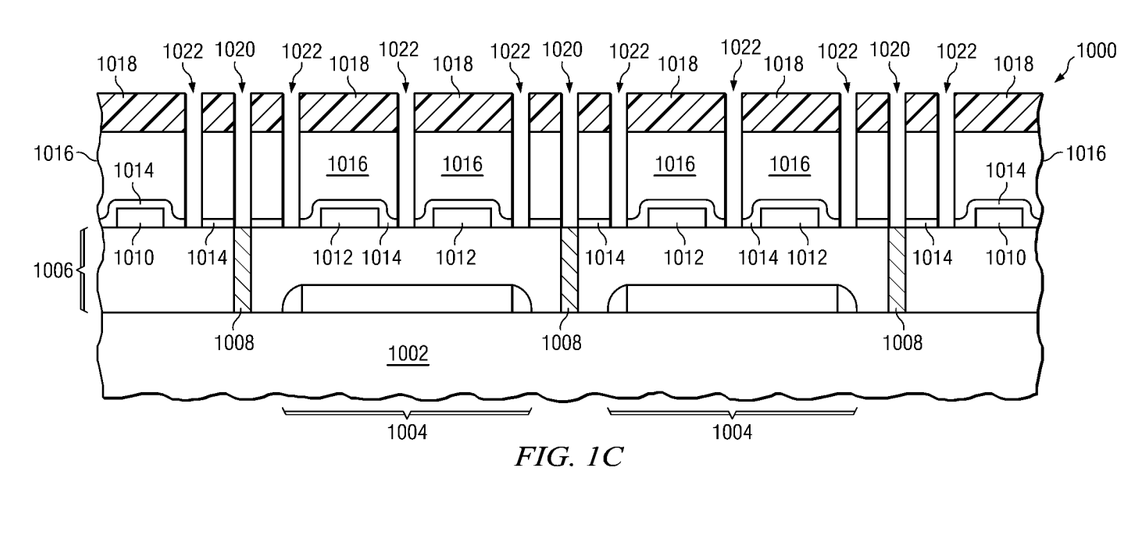

Referring to FIG. 1C, an inter-level dielectric (ILD) layer (1016) is formed over the hydrogen barrier (1014). The ILD layer (1016) may include low-k materials such as organo-silicate glass (OSG), carbon-doped silicon oxides (SiCO or CDO) or methylsilsesquioxane (MSQ). A via photoresist pattern (1018) is formed over the ILD layer (1016) to define the holes for the electrically active via areas (1020) and the dummy via areas (1022). Electrically active via areas (1020) are patterned over the contacts (1008) and possibly over the electrically active ferroelectric structures (1010). Dummy via areas (1022) are patterned in areas free of the contacts (1008), the electrically active ferroelectric structures (1010) and the electrically inactive ferroelectric structures (1012). Material is removed from the ILD layer (1016) and the hydrogen barrier (1014) in the electrically active via areas (1020) and dummy via areas (1022) using etch processes to form via holes through the ILD layer (1016) and the hydrogen barrier (1014). The via photoresist pattern (1018) is then removed, commonly by exposing the IC (1000) to an oxygen containing plasma, followed by a wet cleanup to remove any organic residue from a top surface of the ILD layer (1016).

Figure 1D:
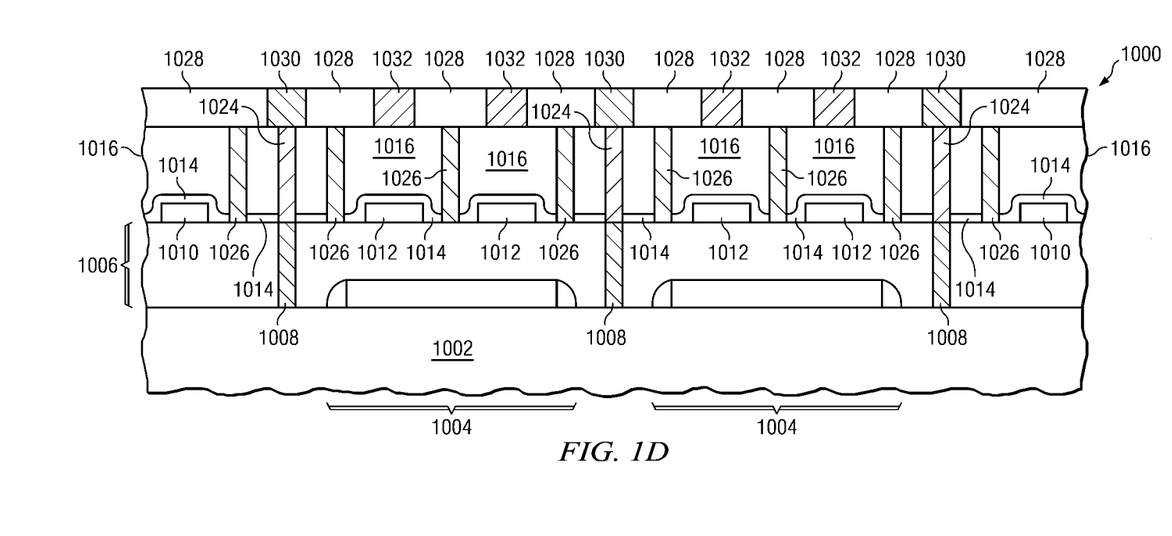

Referring to FIG. 1D, electrically active vias (1024) and dummy vias (1026) are formed by depositing via metal in the via holes. The electrically active vias (1024) make electrical connections to the contacts (1008). At least a portion of bottom surfaces of the dummy vias (1026) contact the dielectric layer (1006). The dummy vias (1026) are hydrogen permeable which allows hydrogen to diffuse from the ILD layer (1016) to the dielectric layer (1006). The dummy vias (1026) may be configured in a linear array or a rectangular array that is symmetrically positioned over each component (1004). In one embodiment, the dummy vias (1026) may be configured so that a density of dummy vias (1026) is maintained within a desired range, for example between 10,000 vias/mm$^2$ and 100,000 vias/mm$^2$, to increase a process latitude of the etch processes used to form the via holes. Lateral separations of the dummy vias (1026) may be established during a design phase of the integrated circuit formation process sequence.

Following formation of the electrically active vias (1024) and dummy vias (1026), an intra-metal dielectric (IMD) layer (1028) is formed over the ILD layer (1016). The IMD layer (1028) may be formed of similar materials as the ILD layer (1016). Electrically active metal interconnect lines (1030) are formed in the IMD layer (1028). The electrically active metal interconnect lines (1030) may be formed using aluminum metallization methods, copper metallization methods, or other metallization methods. One or more of the electrically active metal interconnect lines (1030) make electrical connections to the electrically active vias (1024). A first set of optional electrically inactive metal interconnect structures (1032) may be formed over, and in a configuration aligned with, the electrically inactive ferroelectric structures (1012). The electrically inactive metal interconnect structures (1032), if present, may be formed concurrently with the electrically active metal interconnect lines (1030).

Figure 1E:
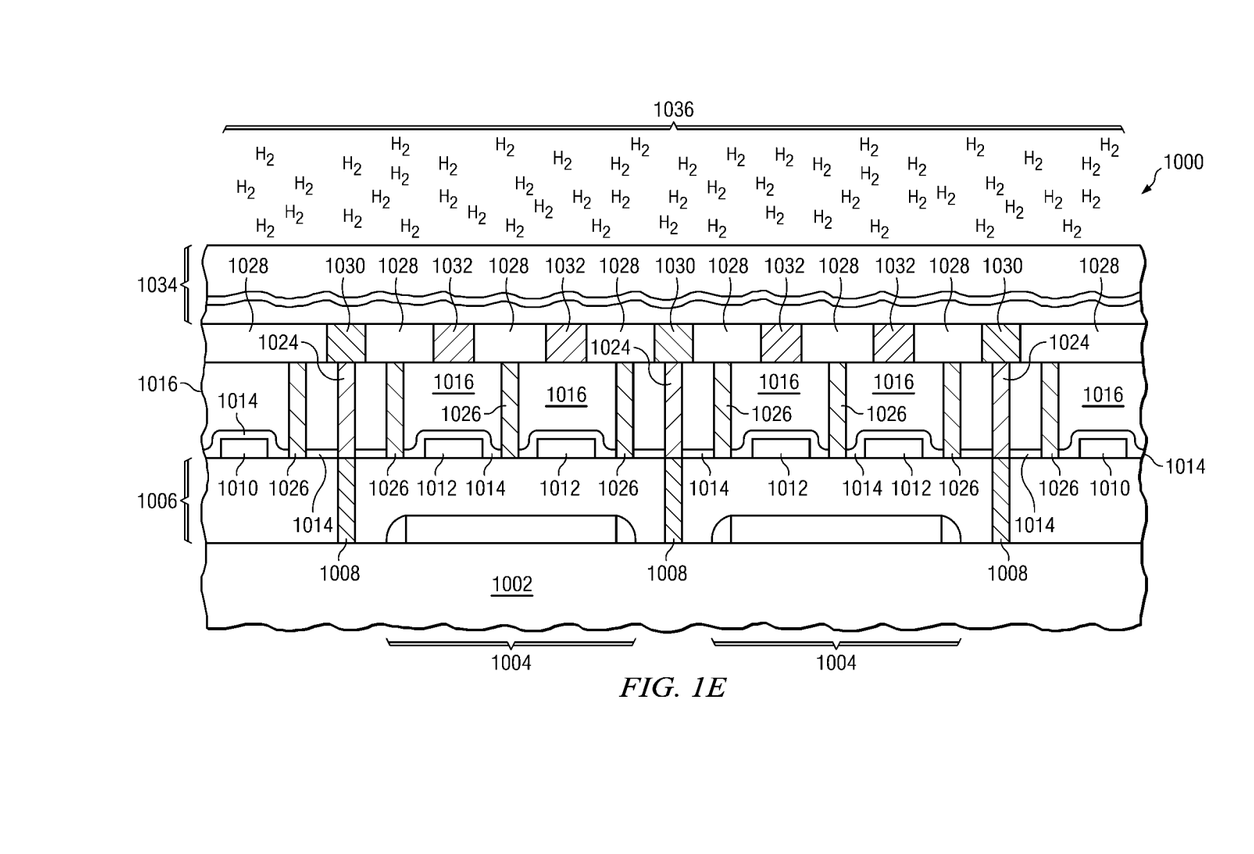

Referring to FIG. 1E, additional layers (1034) of dielectric material, metal interconnect lines and metal vias, known as back end layers (1034), may be formed above the IMD layer (1028). Hydrogen may be introduced to the integrated circuit (1000) by various processes during the fabrication of the IMD layer (1028), the metal interconnect lines (1030, 1032) and the additional back end layers (1034) (including metal anneal processes, dielectric material deposition processes, and deposition of tungsten by CVD processes). The integrated circuit (1000) may also be exposed to a hydrogen containing ambient (1036). The hydrogen containing ambient (1036) contains, for example, at least 1 percent hydrogen gas at a temperature between 250 C and 600 C. During this process hydrogen atoms may diffuse through the layers (1034, 1028, 1016) and through the hydrogen permeable metal in the dummy vias (1026) to the components (1004).

Figure 2:
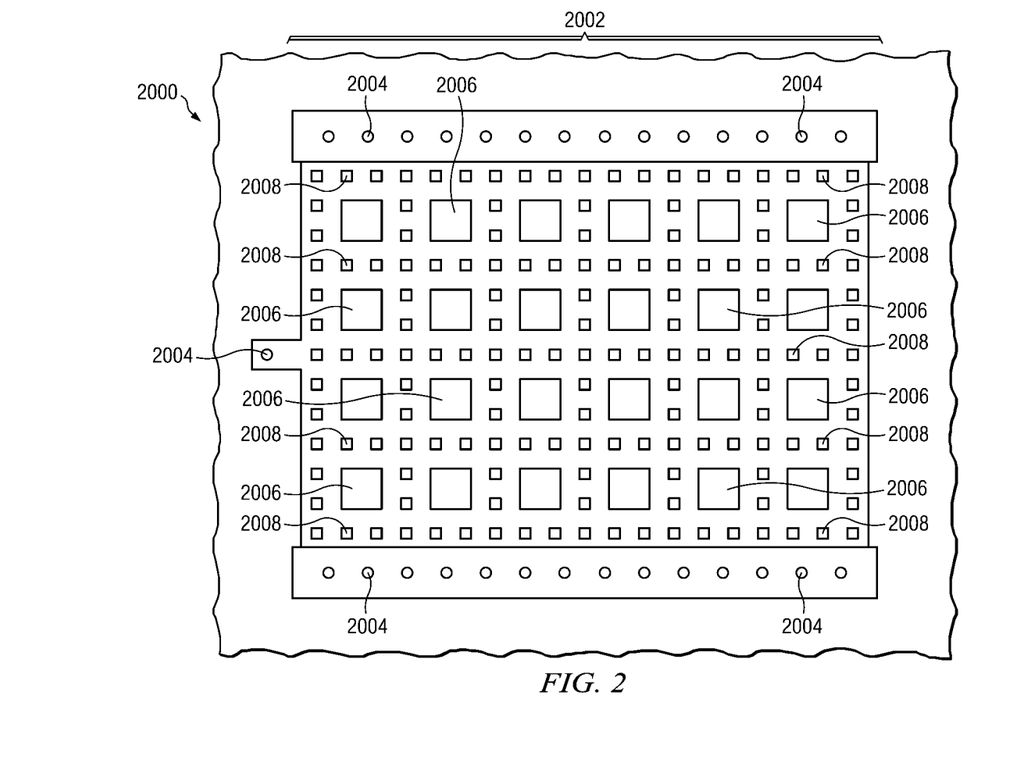
FIG. 2 is a top view of electrically inactive ferroelectric structures and hydrogen permeable dummy vias configured in a rectangular array over a component in an integrated circuit, according to an embodiment of the instant invention.

FIG. 2 is a top view of electrically inactive ferroelectric structures and hydrogen permeable dummy vias configured in a rectangular array over a component in an integrated circuit, according to an embodiment. The integrated circuit (2000) contains a component (2002) that is depicted in FIG. 2 as an MOS transistor for exemplary purposes. The component (2002) may include contacts (2004). A hydrogen barrier (not shown) is formed over the component (2002). Electrically inactive ferroelectric structures (2006) and dummy vias (2008) are formed over the component (2002) in a rectangular array. This may be accomplished, for example, by configuring the electrically inactive ferroelectric structures (2006) and dummy vias (2008) at spatial intervals with less than 20 percent variation over lateral extents of the component (2002). The electrically inactive ferroelectric structures (2006) and dummy vias (2008) may be located over the component (2002) so that opposite edges of the component (2002) are equidistant from instances of the electrically inactive ferroelectric structures (2006) and dummy vias (2008).

Figure 3:
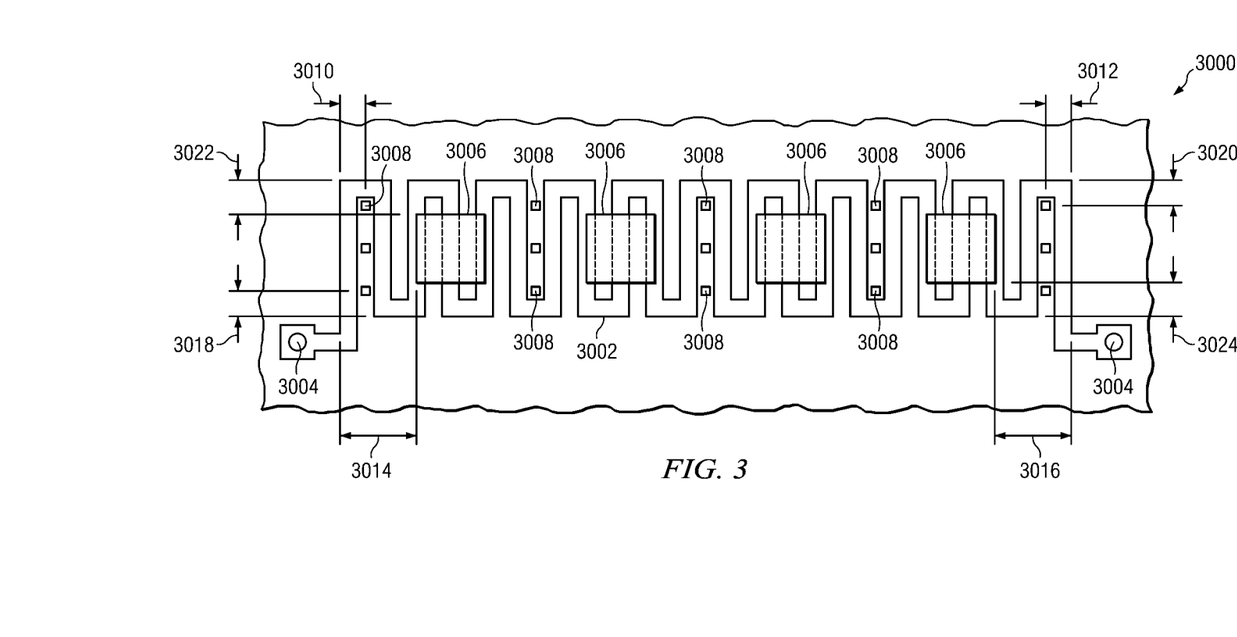
FIG. 3 is a top view of electrically inactive ferroelectric structures and hydrogen permeable dummy vias configured in a linear array over a component in an integrated circuit, according to an embodiment of the instant invention.

FIG. 3 is a top view of electrically inactive ferroelectric structures and hydrogen permeable dummy vias configured in a linear array over a component in an integrated circuit, according to an embodiment. The integrated circuit (3000) contains the component (3002) that is depicted in FIG. 3 as a resistor for exemplary purposes. The component (3002) may have a width comparable to dimensions of the electrically inactive ferroelectric structures. In addition, the component (3002) may include contacts (3004) and a hydrogen barrier (not shown) is formed over the component (3002). Dummy vias (3008) and possibly electrically inactive ferroelectric structures (3006) are formed over the component (3002) in a linear array. The electrically inactive ferroelectric structures (3006) and dummy vias (3008) are located over the component (3002) so that opposite ends of the component (3002) are equidistant from instances of the electrically inactive ferroelectric structures (3006) and dummy vias (3008). Specifically, a distance (3010) between a first end of the component (3002) to the closest dummy via (3008) is equal to a distance (3012) between a second end of the component (3002) to the closest dummy via (3008). In addition, a distance (3014) between the first end of the component (3002) to the closest electrically inactive ferroelectric structure (3006) is equal to a distance (3016) between the second end of the component (3002) to the closest electrically inactive ferroelectric structure (3006).

Similarly, the electrically inactive ferroelectric structures (3006) and dummy vias (3008) are located over the component (3002) so that opposite sides of the component (3002) are equidistant from instances of the electrically inactive ferroelectric structures (3006) and dummy vias (3008). Specifically, a distance (3018) between a first side of the component (3002) to the closest dummy via (3008) is equal to a distance (3020) between a second side of the component (3002) to the closest dummy via (3008). In addition, a distance (3022) between the first side of the component (3002) to the closest electrically inactive ferroelectric structure (3006) is equal to a distance (3024) between the second side of the component (3002) to the closest electrically inactive ferroelectric structure (3006).

Figure 4A:
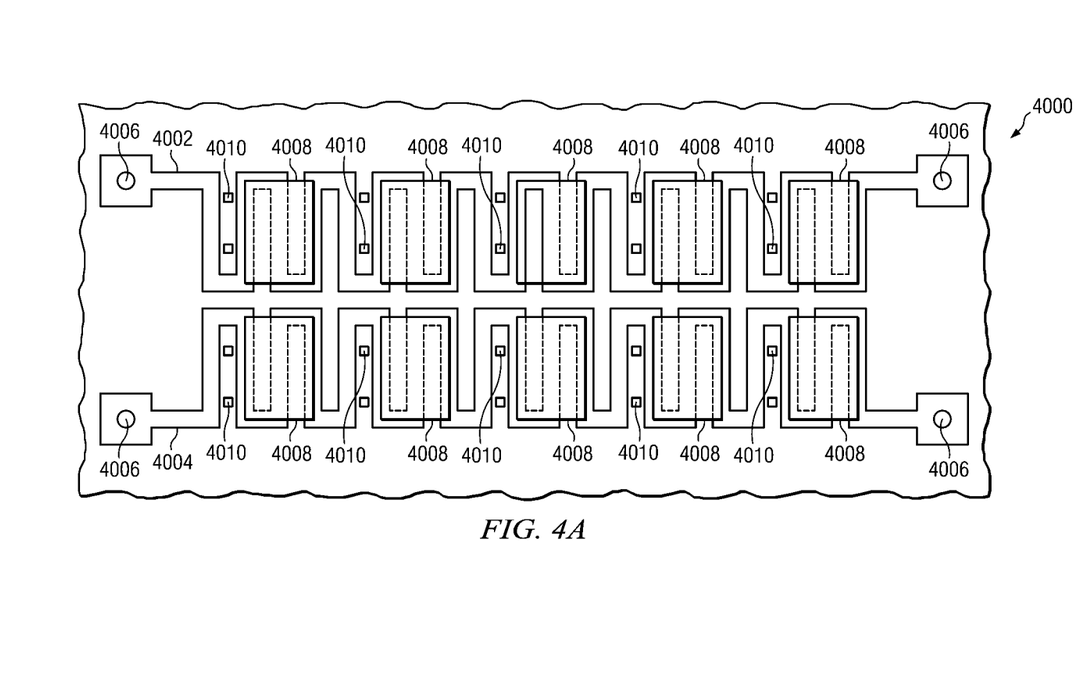
FIG. 4A through FIG. 4B are top views of electrically inactive ferroelectric structures and hydrogen permeable dummy vias configured over a set of matched components in an integrated circuit, according to an embodiment of the instant invention.
Figure 4B:
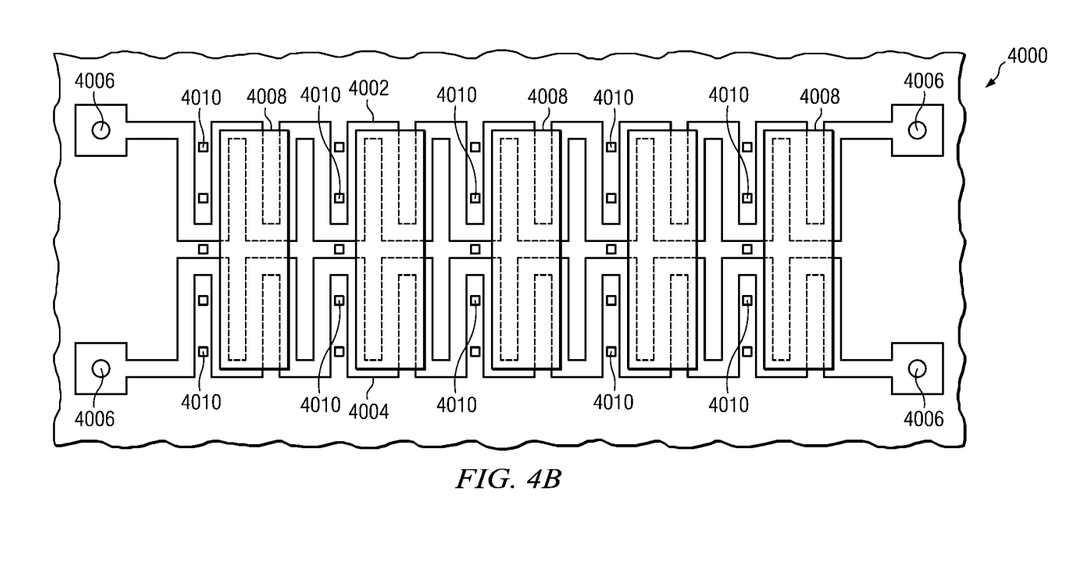

Some integrated circuits with hydrogen barriers include matched components, such as resistors or MOS transistors, which may be affected by mechanical stress and exposure to hydrogen. The electrical performance of circuits containing matched components may benefit if electrically inactive ferroelectric structures and hydrogen permeable dummy vias are located over the matched components in identical configurations to provide substantially equal levels of mechanical stress and hydrogen exposure to the matched components. (Note that mechanical stress and hydrogen exposure variations across the integrated circuit may be exhibited between arrays of electrically inactive ferroelectric structures and hydrogen permeable dummy vias with identical layouts.) FIG. 4A is a top view of electrically inactive ferroelectric structures and hydrogen permeable dummy vias configured over a set of matched components in an integrated circuit, according to an embodiment. The method for fabricating the structures shown in FIGS. 4A (and 4B) may be similar to the fabrication method discussed supra and illustrated in FIGS. 1A-1E. The integrated circuit (4000) contains a first matching component (4002) and a second matching component (4004). A layout of the first matching component (4002) is identical with that of the second matching component (4004). The first matching component (4002) may be located proximate to the second matching component (4004); that is, adjacent boundaries of the matched component (4002) and (4004) are within a distance less than a lateral dimension of either matched component (4002) or (4004). The matched components (4002) and (4004) may include contacts (4006). A hydrogen barrier (not shown) is formed over the matching components (4002) and (4004). Electrically inactive ferroelectric structures (4008) and dummy vias (4010) are formed over the matched components (4002) and (4004) in identical configurations, possibly with reflection symmetry, as depicted in FIG. 4A. Alternatively, the matched components (4002) and (4004) may share electrically inactive ferroelectric structures (4008) or dummy vias (4010), as shown in FIG. 4B. The electrically inactive ferroelectric structures (4008) and dummy vias (4010) so configured may provide substantially identical levels of mechanical stress and hydrogen exposure. The lateral dimensions and spatial separations of the electrically inactive ferroelectric structures (4008) may be established during a design phase of the integrated circuit formation process sequence. Similarly, spatial separations of the adjusted spacing hydrogen permeable dummy vias (4010) may be established during a design phase of the integrated circuit formation process sequence.

Figure 5:
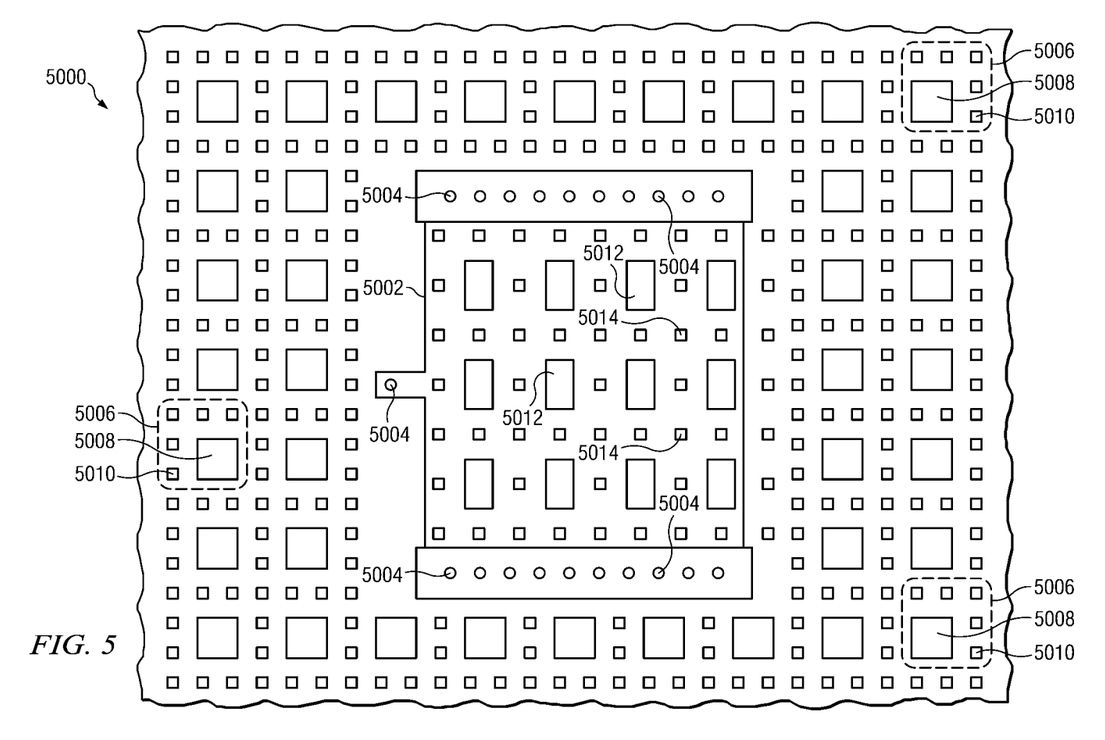
FIG. 5 is a top view of electrically inactive ferroelectric structures and hydrogen permeable dummy vias with adjusted lateral dimensions and spacing, configured over a component in an integrated circuit, according to an embodiment of the instant invention.

Standard dummy cells of electrically inactive ferroelectric structures and hydrogen permeable dummy vias may be located across an entire integrated circuit to improve process latitudes of etch processes used to form the electrically active ferroelectric structures and vias. Conversely, the lateral dimensions or spacing of electrically inactive ferroelectric structures and hydrogen permeable dummy vias over a component in the integrated circuit may be placed differently than the standard dummy cells so as to provide symmetric coverage over a single component in the integrated circuit. FIG. 5 is a top view of electrically inactive ferroelectric structures and hydrogen permeable dummy vias with adjusted lateral dimensions and spacing, configured over a component in an integrated circuit, according to an embodiment. The integrated circuit (5000) contains a component (5002) that is depicted in FIG. 5 as an MOS transistor for exemplary purposes. The component (5002)

may include contacts (5004). A hydrogen barrier (not shown) is formed over the component (5002). Standard dummy cells (5006) of standard sized electrically inactive ferroelectric structures (5008) and standard spaced hydrogen permeable dummy vias (5010) are formed in the integrated circuit (5000). Adjusted size electrically inactive ferroelectric structures (5012) and adjusted spacing hydrogen permeable dummy vias (5014) are formed over the component (5002) in a rectangular array which is symmetrically positioned over the component (5002). The size or spacing of the adjusted size electrically inactive ferroelectric structures (5012) are different than the size and spacing of the standard sized electrically inactive ferroelectric structures (5008). Similarly, the spacing of the adjusted spacing hydrogen permeable dummy vias (5014) is different then the spacing of the standard spaced hydrogen permeable dummy vias (5010). The lateral dimensions of the adjusted size electrically inactive ferroelectric structures (5012) may be established during a design phase of the integrated circuit formation process sequence. Similarly, the lateral separations of the adjusted spacing hydrogen permeable dummy vias (5014) may be established during a design phase of the integrated circuit formation process sequence.

Figure 6:
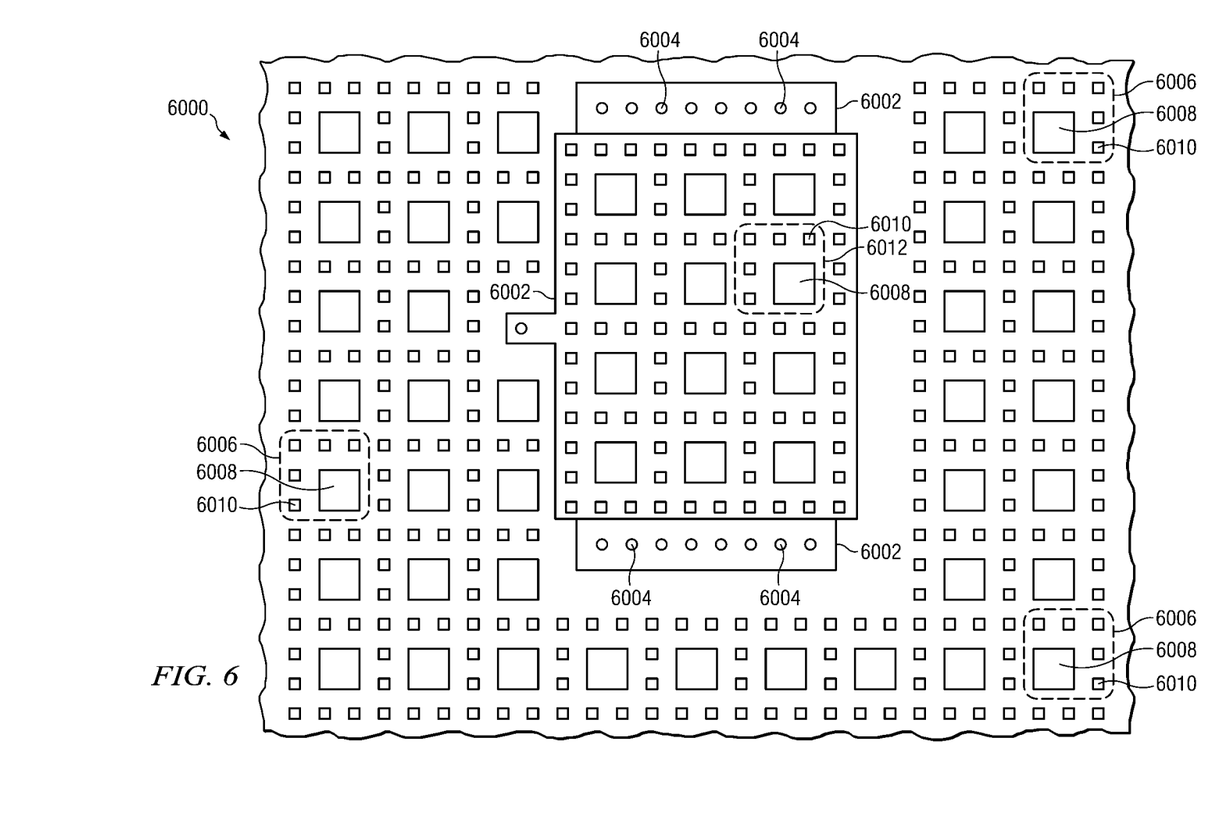
FIG. 6 is a top view of electrically inactive ferroelectric structures and hydrogen permeable dummy vias with adjusted locations, configured over a component in an integrated circuit, according to an embodiment of the instant invention.

Some components may have locations in integrated circuits such that coverage by the standard dummy cells located on standard sites does not provide symmetric coverage of the components, that is that opposite edges of the components are equidistant from instances of the standard dummy cells within 20 percent of the spatial intervals separating the instances of the standard dummy cells. In such cases (as illustrated in this embodiment), the locations of the standard sized electrically inactive ferroelectric structures and the standard spaced hydrogen permeable dummy vias may be adjusted during a design phase of the integrated circuit formation process sequence to provide symmetric coverage of the components. FIG. 6 is a top view of electrically inactive ferroelectric structures and hydrogen permeable dummy vias with adjusted locations, configured over a component in an integrated circuit, according to this embodiment. The integrated circuit (6000) contains a component (6002) that is depicted in FIG. 6 as an MOS transistor for exemplary purposes. The component (6002) may include contacts (6004). A hydrogen barrier (not shown) is formed over the component (6002). Standard dummy cells (6006) of standard sized electrically inactive ferroelectric structures (6008) and standard spaced hydrogen permeable dummy vias (6010) are formed in the integrated circuit (6000). Positions of the standard cells with shifted locations (6012) are offset from the standard dummy cells (6006). Standard cells with shifted locations (6012) of standard sized electrically inactive ferroelectric structures (6008) and standard spaced hydrogen permeable dummy vias (6010) are formed over the component (6002) so as to provide symmetric coverage.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a substrate;
a component located on said substrate;
a dielectric layer located on said substrate and above said component;
a plurality of electrically active ferroelectric structures located over said dielectric layer;
a hydrogen barrier located above said electrically active ferroelectric structures;
an inter-level dielectric layer located on said hydrogen barrier;
a plurality of electrically active vias located in said inter-level dielectric layer and said hydrogen barrier; and
a plurality of hydrogen permeable dummy vias configured in one of a linear array or a rectangular array, said plurality of hydrogen permeable dummy vias symmetrically positioned over said component and located in said inter-level dielectric layer and said hydrogen barrier such that at least a portion of bottom surfaces of said plurality of hydrogen permeable dummy vias contact said dielectric layer.

2. The integrated circuit of claim 1, further including a plurality of electrically inactive ferroelectric structures configured in one of a linear array or a rectangular array, said plurality of electrically inactive ferroelectric structures symmetrically positioned over said component and also located over said dielectric layer but under said hydrogen barrier.

3. The integrated circuit of claim 2, in which said plurality of electrically inactive ferroelectric structures include lead zirconium titanate.

4. The integrated circuit of claim 2 further comprising a first sized electrically inactive ferroelectric structures and a first spaced hydrogen permeable dummy vias that are located outside a parameter of said component, and further where said plurality of hydrogen permeable dummy vias have a second spacing plus said plurality of electrically inactive ferroelectric structures have a second size.

5. The integrated circuit of claim 2 further comprising a first sized electrically inactive ferroelectric structures and a first spaced hydrogen permeable dummy vias that are located outside a parameter of said component, where a spacing of said plurality of hydrogen permeable dummy vias equals said first spaced hydrogen permeable dummy vias plus a size of said plurality of electrically inactive ferroelectric structures equals said first sized electrically inactive ferroelectric structures, and further where locations of said plurality of hydrogen permeable dummy vias and said plurality of electrically inactive ferroelectric structures are offset from locations of said first sized electrically inactive ferroelectric structures and first spaced hydrogen permeable dummy vias.

6. The integrated circuit of claim 1, further including a plurality of electrically inactive ferroelectric structures configured in a rectangular array, said plurality of electrically inactive ferroelectric structures symmetrically positioned over said component and also located over said dielectric layer but under said hydrogen barrier.

7. An integrated circuit, comprising:
a substrate;
a first matching component located on said substrate;
a second matching component located on said substrate with a layout identical to that of said first matching component;
a dielectric layer located on said substrate and above said first matching component and said second matching component;
a plurality of electrically active ferroelectric structures located over said dielectric layer;

a hydrogen barrier located above said plurality of electrically active ferroelectric structures;
an inter-level dielectric layer located on said hydrogen barrier;
a plurality of electrically active vias located in said inter-level dielectric layer and said hydrogen barrier;
a first plurality of hydrogen permeable dummy vias in a dummy via configuration and positioned over said first matching component and located in said inter-level dielectric layer and said hydrogen barrier such that at least a portion of bottom surfaces of said first plurality of hydrogen permeable dummy vias contact said dielectric layer; and
a second plurality of hydrogen permeable dummy vias in said dummy via configuration and positioned over said second matching component and located in said inter-level dielectric layer and said hydrogen barrier such that at least a portion of bottom surfaces of said second plurality of hydrogen permeable dummy vias contact said dielectric layer.

8. The integrated circuit of claim 7, further including:
a first plurality of electrically inactive ferroelectric structures in a ferroelectric structure configuration and positioned over said first matching component, said first plurality of electrically inactive ferroelectric structures located over said dielectric layer and under said hydrogen barrier; and
a second plurality of electrically inactive ferroelectric structures in said ferroelectric structure configuration and positioned over said second matching component, said second plurality of electrically inactive ferroelectric structures located over said dielectric layer and under said hydrogen barrier.

9. The integrated circuit of claim 8, in which said electrically inactive ferroelectric structures include lead zirconium titanate.

10. The integrated circuit of claim 7, in which said dummy via configuration is a rectangular array.

11. The integrated circuit of claim 10, further including:
a first plurality of electrically inactive ferroelectric structures in a ferroelectric structure configuration and positioned over said first matching component, said first plurality of electrically inactive ferroelectric structures located over said dielectric layer and under said hydrogen barrier; and
a second plurality of electrically inactive ferroelectric structures in said ferroelectric structure configuration and positioned over said second matching component, said second plurality of electrically inactive ferroelectric structures located over said dielectric layer and under said hydrogen barrier.

12. The integrated circuit of claim 7, in which said dummy via configuration is a linear array.

13. The integrated circuit of claim 12, further including:
a first plurality of electrically inactive ferroelectric structures in a ferroelectric structure configuration and positioned over said first matching component, said first plurality of electrically inactive ferroelectric structures located over said dielectric layer and under said hydrogen barrier; and
a second plurality of electrically inactive ferroelectric structures in said ferroelectric structure configuration and positioned over said second matching component, said second plurality of electrically inactive ferroelectric structures located over said dielectric layer and under said hydrogen barrier.

14. A process of forming an integrated circuit, comprising the steps of:
providing a substrate;
forming a first matching component on said substrate;
forming a second matching component on said substrate with a layout identical to that of said first matching component;
forming a dielectric layer on said substrate and above said first matching component and said second matching component;
forming a plurality of electrically active ferroelectric structures on said dielectric layer;
forming a hydrogen barrier above said electrically active ferroelectric structures;
forming an inter-level dielectric layer on said hydrogen barrier;
forming a first plurality of via holes for electrically active vias through said inter-level dielectric layer and through said hydrogen barrier;
forming a second plurality of via holes for dummy vias through said inter-level dielectric layer and through said hydrogen barrier in a dummy via configuration and positioned over said first matching component;
forming a third plurality of via holes for dummy vias through said inter-level dielectric layer and through said hydrogen barrier in said dummy via configuration and positioned over said second matching component;
forming a plurality of electrically active vias in said first plurality of said via holes;
forming a first plurality of hydrogen permeable dummy vias in said second plurality of said via holes such that at least a portion of bottom surfaces of said first plurality of said hydrogen permeable dummy vias contact said dielectric layer; and
forming a second plurality of hydrogen permeable dummy vias in said third plurality of said via holes such that at least a portion of bottom surfaces of said second plurality of said hydrogen permeable dummy vias contact said dielectric layer.

15. The process of claim 14, further including:
forming a first plurality of electrically inactive ferroelectric structures in a ferroelectric structure configuration over said first matching component, over said dielectric layer, and under said hydrogen barrier; and
forming a second plurality of electrically inactive ferroelectric structures in said ferroelectric structure configuration over said second matching component, over said dielectric layer, and under said hydrogen barrier.

16. The process of claim 15, in which said electrically inactive ferroelectric structures include lead zirconium titanate.

17. The process of claim 14, in which said dummy via configuration is a rectangular array.

18. The process of claim 17, further including:
forming a first plurality of electrically inactive ferroelectric structures in a ferroelectric structure configuration over said first matching component, over said dielectric layer, and under said hydrogen barrier; and
forming a second plurality of electrically inactive ferroelectric structures in said ferroelectric structure configuration over said second matching component, over said dielectric layer, and under said hydrogen barrier.

19. The integrated circuit of claim 14, in which said dummy via configuration is a linear array.

20. The process of claim 19, further including:
forming a first plurality of electrically inactive ferroelectric structures in a ferroelectric structure configuration over said first matching component, over said dielectric layer, and under said hydrogen barrier; and forming a second plurality of electrically inactive ferroelectric structures in said ferroelectric structure configuration over said second matching component, over said dielectric layer, and under said hydrogen barrier.

\* \* \* \* \*